United States Patent [19]

Malhi

[11] Patent Number: 5,686,755
[45] Date of Patent: Nov. 11, 1997

[54] LDMOS RESURF HIGH VOLTAGE TRANSISTOR

[75] Inventor: Satwinder Malhi, Garland, Tex.

[73] Assignee: Texas Instruments Incorporated, Dallas, Tex.

[21] Appl. No.: 771,371

[22] Filed: Dec. 16, 1996

Related U.S. Application Data

[63] Continuation of Ser. No. 342,398, Nov. 18, 1994, abandoned, which is a continuation of Ser. No. 317, Jan. 4, 1993, abandoned.

[51] Int. Cl.$^6$ ............................. H01L 23/58; H01L 29/76
[52] U.S. Cl. ..................... 257/492; 257/493; 257/343; 257/347
[58] Field of Search ........................... 257/345, 347, 257/408, 409, 492, 339, 343, 629, 630, 336, 348, 493, 496, 487, 488, 491; 437/29, 40, 41, 69, 70, 984, 24, 913

[56] References Cited

U.S. PATENT DOCUMENTS

| 4,866,495 | 9/1989 | Kinzer | 257/492 |
| 5,113,236 | 5/1992 | Arnold et al. | 257/347 |

FOREIGN PATENT DOCUMENTS

| 0 562 271 A1 | 2/1993 | European Pat. Off. |
| 56-142673 | 7/1981 | Japan. |
| 63-69271 | 3/1988 | Japan. |

OTHER PUBLICATIONS

High Voltage Silicon–on–Insulator (SOI) MOSFETs', proceedings of the 3rd International Symposium on Power Semiconductor Devices, ISPSD '91 Baltimore, Maryland, Apr. 22–24, Qin Lu, et al.

High Voltage DMOS Power FETs on Thin SOI Substrates 1990 *IEEE SOS/SOI Technology Conference*, Oct. 22–4 1990, J.M. O'Connor, et al.

J.A. Appels and H.M.J. Vaes, "High Voltage Thin Layer Devices (Resurf Devices)," *IEDM Tech. Digest*, pp. 238–241, 1979.

*Primary Examiner*—Carl W. Whitehead, Jr.
*Attorney, Agent, or Firm*—Jacqueline J. Garner; W. James Brady, III; Richard L. Donaldson

[57] ABSTRACT

A high voltage transistor includes a semiconductor-on-insulator (SOI) region in which a source and a channel are formed. A drain drift region is further formed partly in the SOI region and partly in the bulk silicon region beyond SOI and a gate is coupled to said SOI channel.

4 Claims, 2 Drawing Sheets

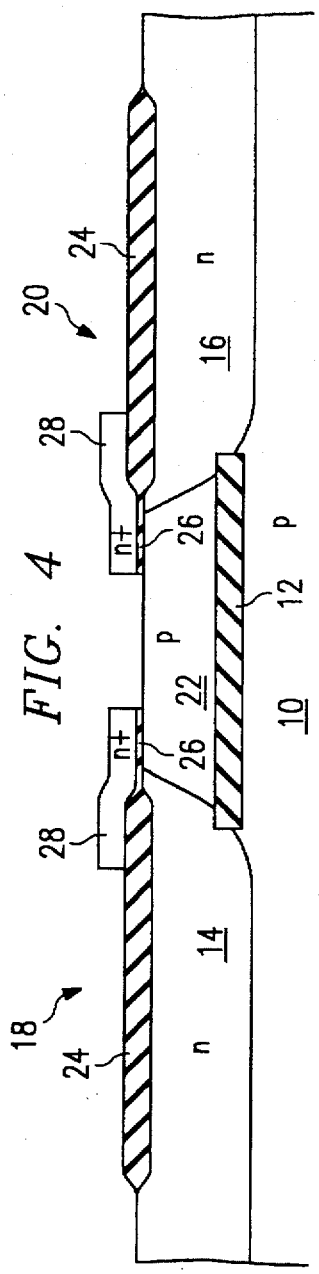
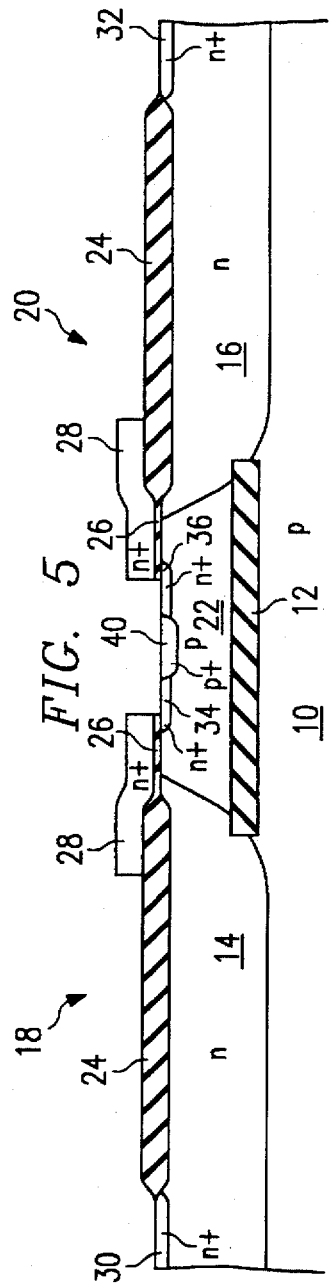
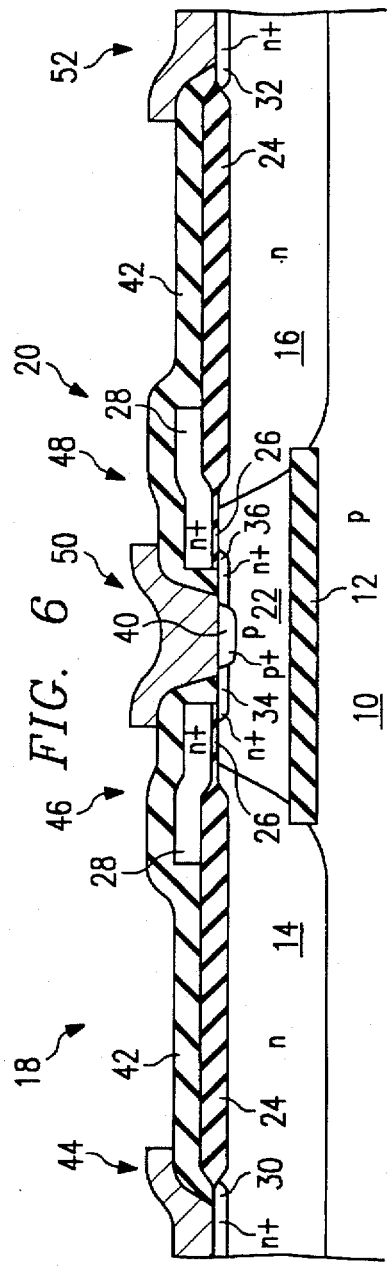

LDMOS RESURF HIGH VOLTAGE TRANSISTOR

This application is a continuation of application Ser. No. 08/342,398, filed Nov. 18, 1994, now abandoned, which is a continuation of Ser. No. 08/000,317, filed Jan. 4, 1993, now abandoned.

TECHNICAL FIELD OF THE INVENTION

This invention relates in general to the field of semiconductor integrated circuits, and more particularly the present invention relates to high voltage devices.

BACKGROUND OF THE INVENTION

There has been much recent progress in the field of power transistors, such as LDMOS (lateral double diffused MOS) power transistors with low "on-resistance" ($Rds_{ON}$), and RESURF (reduced surface field) devices. Please refer to Appels, J. A. and Vaes, H. M. J., "High Voltage Thin Layer Devices (RESURF Devices)," *IEDM Tech. Digest*, pp. 238–241, 1979, for a more detailed description of the RESURF technology.

Power devices are typically used in two circuit configurations, as a low side driver or a high side driver. In a low side driver circuit configuration, the drain of the power device is coupled to the power supply through a load circuit, and its source is coupled to ground. In a high side driver circuit configuration, the drain is coupled directly to a power supply, and the source is coupled to ground through a load circuit. RESURF LDMOS transistors are commonly used in the low side driver configuration because the source is structurally coupled to the substrate which in turn is coupled to ground. Therefore, these power devices are not used in high side driver applications and other applications where electrical isolation between the source and substrate is desirable.

Accordingly, it is desirable to provide a high voltage device with electrical isolation between source and substrate to be used as a high side driver. Additionally, it is necessary that such high power device exhibit low on-resistance ($Rds_{ON}$) characteristics.

SUMMARY OF THE INVENTION

In accordance with the present invention, a high voltage high-side driver RESURF LDMOS is provided which eliminates problems associated with prior RESURF LDMOS power transistors.

In one aspect of the present invention, a high voltage transistor includes a semiconductor-on-insulator (SOI) region in which a source and a channel are formed. A bulk semiconductor drain drift region is further formed beyond the SOI region and a gate is coupled to said SOI channel.

In another aspect of the present invention, a method for fabricating a high voltage transistor includes forming a localized SOI region in a semiconductor substrate, and forming a source region in the SOI region. A drain and a drain drift region is further formed in the substrate generally outside of the SOI region. A gate is then formed above the SOI channel and between the source region and the drain drift region.

An important technical advantage of the present invention is that due to its isolated source, the device can be used in high side driver circuit configuration. Furthermore, constructed in a manner consistent with the teachings of the invention, the planar structure of the high voltage transistor may be fabricated with fewer steps and with existing fabrication processes. Since the drain drift region is built primarily in the bulk, width limitations of Epitaxial Lateral Overgrowth (ELO) SOI material does not limit the design of high voltage device with long drift region.

BRIEF DESCRIPTION OF THE DRAWINGS

For a better understanding of the present invention, reference may be made to the accompanying drawings, in which:

FIG. 4 is a cross-sectional view of a wafer in a subsequent step of fabrication;

FIG. 5 is a cross-sectional view of a wafer in a subsequent step of fabrication;

FIG. 6 is a cross-sectional view of a preferred embodiment of the invention.

DETAILED DESCRIPTION OF THE INVENTION

Figure 1:
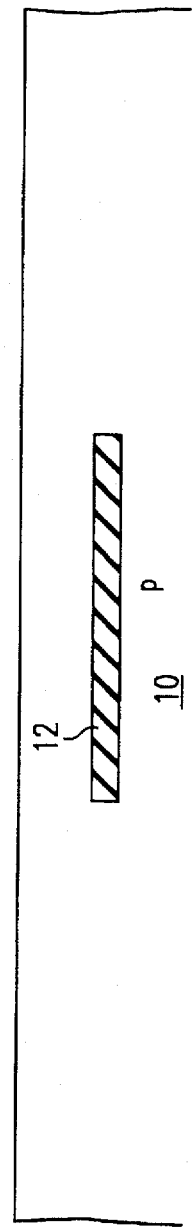
FIG. 1 is a cross-sectional view of a wafer in a first step of fabrication.

The preferred embodiment of the present invention and its advantages are best understood by referring to FIGS. 1–7 of the drawings, like numerals being used for like and corresponding parts of the various drawing figures. The views shown in the drawing figures are not to scale, and certain dimensions may have been greatly exaggerated or diminished for clarity. With reference to the drawings, FIG. 1 illustrates a wafer 10 having a p-type substrate and a buried oxide layer 12. Buried oxide layer 12 may be formed with silicon or semiconductor-on-insulator (SOI) techniques, such as Epitaxial Lateral Overgrowth (ELO) SOI, vertical DELTA SOI (fully depleted lean channel transistor) technology (Hisamoto, Digh et al., *Impact of the Vertical SOI "DELTA" Structure on Planar Device Technology*, IEEE Transactions on Electron Devices, Vol. 38, No. 6, June 1991, pp. 1419–1424), wafer bonding, SIMOX (separation by implanted oxygen), and other implantation techniques. Preferably, buried oxide layer 12 is positioned approximately 2–3 µm below the surface of the wafer 10 and is approximately 1 µm thick and 8 µm wide. In the embodiment shown in FIGS. 1–6, a double device back-to-back configuration is shown, but single device configurations may also be implemented in a similar manner according to the invention.

Figure 2:
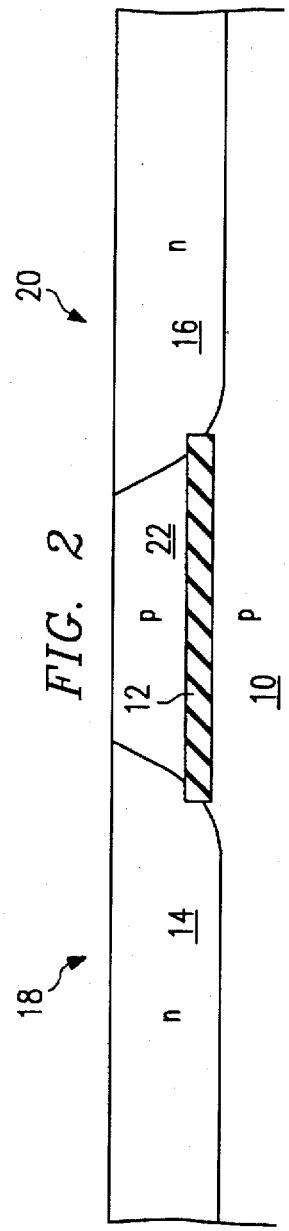
FIG. 2 is a cross-sectional view of a wafer in a subsequent step of fabrication.

Referring to FIG. 2, n-type drain drift regions 14 and 16 are formed in the p-type bulk or substrate near the ends of buried oxide layer 12 for devices 18 and 20. Preferably, the drift regions 14 and 16 extend 4–5 µm below the wafer surface generally to a depth deeper than the buried oxide layer 12. Regions 14 and 16 may be formed by implanting phosphorous ions at a dose of $3 \times 10^{12}/cm^2$ at 100 KeV. Constructed in this manner, drain drift regions 14 and 16 frame therebetween a p-type single crystalline semiconductor channel in the SOI region 22. The structure of the drain drift regions 14, 16 have curved or tapered portions 15, 17 caused by the lateral diffusion of the implanted dopant during the drive-in step, and uniform depth or planar portions 19, 21 where the dopant was vertically implanted, as is well known in the art.

Figure 3:
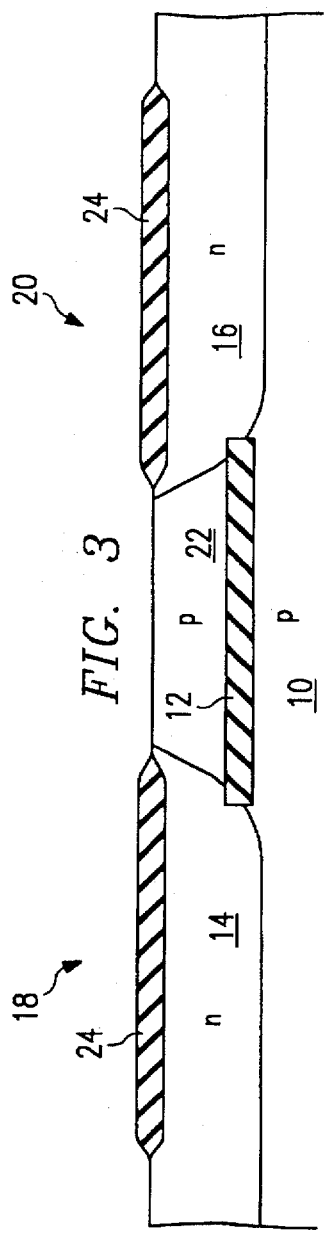
FIG. 3 is a cross-sectional view of a wafer in a subsequent step of fabrication.

In FIG. 3, a LOCOS field oxide layer 24 is formed above the n-type drift regions 14 and 16 as shown. Field oxide 24 is approximately 1 μm thick. Referring to FIG. 4, pattern etched gate oxide layer 26 and n+ doped polysilicon layer 28 are formed. Preferably gate oxide layer 26 is approximately 500 Å thick and gate polysilicon layer 28 is 0.5 μm thick.

Referring to FIG. 5, n+ drain regions 30 and 32 are formed by implantation above drain drift regions 14 and 16, respectively. N+ source regions 34 and 26 are formed in p-type SOI region 22, preferably, by implanting arsenic ions having an approximate dosage of $5 \times 10^{15}/cm^2$ at 100 KeV. An implant of boron ions at about $2 \times 10^{15}/cm^2$ and 30 Kev, for example, forms a p+ region 40 between n+ regions 34 and 36, which makes contact to the body region 22 of devices 18 and 20.

Referring to FIG. 6, a patterned oxide layer 42 is formed, by deposition, etching and reflow, for example, over the devices 18 and 20 but exposing the drain 44, gate 46 and 48 and source/body 50 regions. Metal contacts are subsequently formed at regions 44–50. Note that drain 44, gate 46 and source 50 form the terminals of device 18, and source 50, gate 48 and drain 52 form the terminals of device 20.

Figure 7:
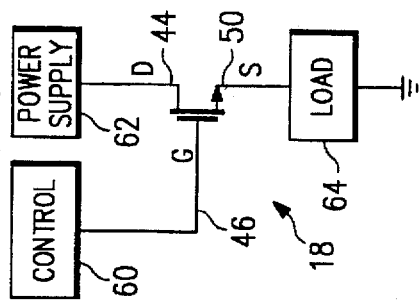
FIG. 7 is a block diagram of a high side driver circuit configuration.

Referring to FIG. 7, high voltage device 18 is shown connected in a high side driver circuit configuration. The gate 46 is coupled to a control circuitry 60, which may include a microprocessor or a distributed processor network. The drain is coupled to a power supply 62. The source of device 18 is coupled to one or more loads 64, which is further connected to ground. Referring also to FIG. 6, the channel 22 and source 34, 36 are built in the SOI region and are thus isolated by the buried oxide layer 12 from the grounded substrate, so that the source 50 can float with the potential of the load circuit. The drift region is primarily built in the bulk region so that SOI width limitations do not adversely affect the length of the drift region which is determined by the required breakdown voltage. Constructed in this manner, RESURF optimization methods may be advantageously utilized.

It is important to note that the fabrication of the invention is not limited to the process parameters described above. Dimensions, impurity ion concentrations, implant energies, and processes may vary in accordance with the teachings of the invention. Although the present invention has been described in detail, it should be understood that various changes, substitutions and alterations can be made thereto without departing from the spirit and scope of the present invention as defined by the appended claims.

What is claimed is:

1. A semiconductor device comprising:
   a substrate having a bulk substrate region and a SOI substrate region; and
   a high voltage transistor located partly within said bulk substrate region and partly within said SOI substrate region, wherein said high voltage transistor comprises:
   a source region located within said SOI substrate region;
   a drift region located substantially in said bulk substrate region;
   a drain region located within said drift region;
   a channel region located within said SOI substrate region extending from said source region to said drift region; and
   a gate electrode extending over said channel region.

2. The semiconductor device of claim 1, wherein said drift region extends deeper into said bulk substrate region than a buried insulator layer of said SOI substrate region.

3. The semi conductor device of claim 1, wherein said drift region comprises a doped region of opposite conductivity type as said substrate, wherein said doped region is located substantially within said bulk substrate region and is directly adjacent said channel region.

4. The semiconductor device of claim 1, further comprising a field oxide region located over a portion of said drift region.

\* \* \* \* \*